(12) United States Patent
Vissenberg et al.

(10) Patent No.: US 10,222,010 B2
(45) Date of Patent: Mar. 5, 2019

(54) BOARD MOUNTED LED ARRAY

(71) Applicant: PHILIPS LIGHTING HOLDING B.V., Eindhoven (NL)

(72) Inventors: Michel Cornelis Josephus Marie Vissenberg, Eindhoven (NL); Anna Wilhelmina Maria Wondergem-De Best, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/753,009

(22) PCT Filed: Aug. 16, 2016

(86) PCT No.: PCT/EP2016/069418
§ 371 (c)(1),
(2) Date: Feb. 15, 2018

(87) PCT Pub. No.: WO2017/029286
PCT Pub. Date: Feb. 23, 2017

(65) Prior Publication Data
US 2018/0306391 A1   Oct. 25, 2018

(30) Foreign Application Priority Data
Aug. 20, 2015   (EP) ..................... 15181765

(51) Int. Cl.
*F21S 4/20* (2016.01)
*F21S 4/10* (2016.01)
(Continued)

(52) U.S. Cl.
CPC . *F21S 4/10* (2016.01); *F21S 4/28* (2016.01); *F21V 29/503* (2015.01); *F21V 29/70* (2015.01);
(Continued)

(58) Field of Classification Search
CPC .... F21S 4/28; F21S 4/20; H05K 2201/09027; H05K 2201/10106
(Continued)

(56) References Cited

U.S. PATENT DOCUMENTS

2010/0165711 A1* 7/2010 Lee ................... G11C 13/0004
                                                               365/163
2013/0182438 A1   7/2013 Cobb
(Continued)

FOREIGN PATENT DOCUMENTS

CN   101834175 A   9/2010
CN   202841695 U   3/2013
(Continued)

*Primary Examiner* — Laura Tso
(74) *Attorney, Agent, or Firm* — Akarsh P. Belagodu

(57) ABSTRACT

A lighting device comprising a carrier board and an array of lighting elements mounted on the carrier board. The carrier board has a generally spiral shape and the carrier board can be tessellated with one or more identical other carrier boards with windings interleaved with each other. This enables multiple carrier boards to be formed from a single substrate with little or no waste of material. Different designs enable two, four or even more different identical carried board shapes to be tessellated together.

4 Claims, 7 Drawing Sheets

(51) Int. Cl.
　　　*F21S 4/28*　　　　(2016.01)
　　　*F21V 29/503*　　　(2015.01)
　　　*F21V 29/70*　　　　(2015.01)
　　　*F21Y 115/10*　　　(2016.01)

(52) U.S. Cl.
　　　CPC . *F21Y 2115/10* (2016.08); *H05K 2201/09027* (2013.01); *H05K 2201/09127* (2013.01); *H05K 2201/09918* (2013.01); *H05K 2201/10106* (2013.01)

(58) Field of Classification Search
　　　USPC ........................................ 362/249.02, 249.06
　　　See application file for complete search history.

(56) References Cited

U.S. PATENT DOCUMENTS

2014/0160749 A1　　6/2014　Lee et al.
2014/0160754 A1　　6/2014　Lee et al.

FOREIGN PATENT DOCUMENTS

| | | |
|---|---|---|
| CN | 203743877 U | 7/2014 |
| CN | 204062571 U | 12/2014 |
| DE | 202009016396 U1 | 3/2010 |
| KR | 200471587 Y1 | 3/2014 |
| WO | WO2010024507 A1 | 3/2010 |
| WO | WO2014079220 A1 | 5/2014 |

\* cited by examiner

BOARD MOUNTED LED ARRAY

CROSS-REFERENCE TO PRIOR APPLICATIONS

This application is the U.S. National Phase application under 35 U.S.C. § 371 of International Application No. PCT/EP2016/069418, filed on Aug. 16, 2016, which claims the benefit of European Patent Application No. 15181765.7, filed on Aug. 20, 2015. These applications are hereby incorporated by reference herein.

FIELD OF THE INVENTION

This invention relates to lighting devices and in particular to lighting devices having an array of lighting elements such as LEDs mounted on a board such as a printed circuit board.

BACKGROUND OF THE INVENTION

For general illumination, large area light sources are often used in order to provide a low peak brightness and hence to give comfortable low-glare lighting. In LED luminaires having an LED array, the small and bright individual LEDs need to be placed relatively far apart on a large area board, such as a printed circuit board, in order to create a large area light source. Usually such a light source is combined with a diffusive plate or foil to hide the individual LEDs.

The trend of LED technology is for smaller LEDs, increased efficiency (and hence lower thermal dissipation) and lower cost. As a result, the LEDs require less PCB area per LED to meet the required thermal and mechanical design constraints. The PCB cost also becomes a more significant part of the total cost (i.e. the Bill Of Materials (BOM)).

One design which has developed as a result of this trend is the so-called E-panel. In such a panel, a rectangular PCB area is halved by cutting the board into two interdigitated (E-shaped) parts that still cover the full area.

This enables two identical substrates to be formed from a single board without wastage of materials. It also enables a shape to be formed which only partially covers the complete area, but without the need to join segments (such as straight line segments) together. A regular array of LEDs can be positioned on the E-shaped board.

As the trend of higher efficiency and lower cost progresses, the E-panels will still have a cost penalty due to unused PCB area. The E-panel design does not for example allow an initial board to be cut into more than two identical parts. The E-panel design is thus not very versatile. There is therefore a need for an alternative design of PCB board, which reduces the unused PCB area.

SUMMARY OF THE INVENTION

The invention is defined by the claims.

According to examples in accordance with an aspect of the invention, there is provided a lighting device comprising a carrier board; and an array of lighting elements mounted on the carrier board, wherein the carrier board has a coil shape with at least two converging windings, allowing the carrier board to be tessellated with one or more identically shaped or similarly shaped other carrier boards with the windings interleaved with each other. The windings comprise straight sections with a 90 degree angle between the adjacent sections along the coil, the perpendicular spacing between adjacent windings being a constant. The straight sections have a width which varies between a narrower width and a wider width, the lighting elements being positioned at the portions with a wider width, and the array of lighting elements forming a regular square or rectangular grid.

The terms "similar" and "similarly" are used in the mathematical sense (i.e. topologically similar) in that the boards which can be tessellated may be scalar stretched versions of each other. This is for example the case if identical carrier board shapes are tessellated, then the tessellated structure is stretched, and separated back into the individual components. Preferably, the carrier board which are tessellated are identical, so that they all form the samples of the same product.

The coil shape enables the carrier board area to be reduced, while enabling multiple such carrier boards to be manufactured initially as a single tessellated design.

The carrier board may for example comprise a printed circuit board, although any substrate may be used that provides suitable thermal and mechanical stability and electrical interconnection.

This includes conventional PCBs (multicore PCBs or single core PCBs and of different materials) as well as printed electronics such as electrical traces printed on a metal substrate.

The coil shape has converging windings, namely which converge towards a central point. The coil windings are formed from straight sections i.e. generally polygonal.

The windings comprise straight sections with a 90 degree angle between the adjacent sections along the coil, wherein the perpendicular spacing between adjacent windings is a constant. This defines a structure which has a square (or rectangular) spiraling shape. The constant spacing between windings means it forms a shape which may be described as a square/rectangular version of an Archimedean spiral. The constant spacing corresponds to a multiple of the width of the straight section. The multiple is then the number of other identical shapes which can be tessellated together with the first.

The carrier board can be tessellated with one identical other carrier board with the windings interleaved with each other. The two may together substantially fill an area. This means two such coil shapes can be formed from a board with minimal or no waste of board material.

The array of lighting elements forms a regular square or rectangular grid. This provides an alternative to the E-panel design.

The carrier board can also be tessellated with three identical other carrier boards with the windings interleaved with each other. Again, the four may substantially fill the board area. This means four such coil shapes can be formed from a board with minimal or no waste of board material.

The design of the lighting device according to the invention enables one or more (for example four) identical coil shapes to be tessellated and which each carry a regular square or rectangular grid of lighting elements. This is because the straight sections have a width which varies between a narrower width and a wider width, with the lighting elements positioned at the portions with a wider width. In this way, the wider portions of one straight section mate with a narrower portion of a laterally adjacent winding of a different coil when the multiple coils are tessellated.

This design also provides a larger carrier board area around each lighting element where heat dissipation is needed, and a thinner carrier board area at the interconnecting parts, so that the use of board material is more efficient.

The narrower width portions may be formed by indents, wherein the indents for one set of alternate straight sections are at an inside edge and the indents for the other set of alternate straight sections are at an outside edge. This means that with each 90 degree rotation between the different coils, the wider parts of along the straight section of one coil mate with the narrower parts of an adjacent straight section of a neighboring coil.

Examples in accordance with another aspect of the invention provide a method of manufacturing a lighting device, the method comprising the steps of forming an array of lighting elements on a carrier board, and separating the carrier board into at least two identically shaped or similarly shaped sections, the array of lighting elements on each section forming a regular square or rectangular grid, wherein each section has a coil shape with multiple converging windings, the windings being interleaved with each other before the separation, wherein the windings comprise straight sections with a 90 degree angle between the adjacent sections along the coil, the perpendicular spacing between adjacent windings being a constant, and wherein the straight sections have a width which varies between a narrower width and a wider width, the lighting elements being positioned at the portions with a wider width.

In this way, multiple boards are formed from a single initial board by separating identical shapes which tessellate together.

The narrower width portions may be formed by indents, wherein the indents for one set of alternate straight sections are at an inside edge and the indents for the other set of alternate straight sections are at an outside edge.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a lighting device comprising a carrier board and an array of lighting elements mounted on the carrier board. The carrier board has a generally spiral or coiled shape and the carrier board can be tessellated with one or more identical other carrier boards with windings interleaved with each other. This enables multiple carrier boards to be formed from a single substrate with little or no waste of material. Different designs enable two, four or even more different identical carrier board shapes to be tessellated together.

Figure 1:
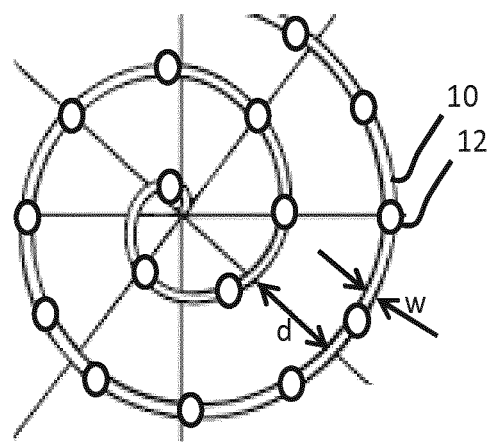
FIG. 1 shows a first example of a lighting device shaped in the form of a spiral.

FIG. 1 shows a first example of lighting device shaped in the form of a spiral. The lighting device comprises a carrier board 10 and an array of lighting elements 12 mounted on the carrier board.

For all examples in accordance with the invention, the carrier board has a coil shape with multiple converging windings, and the carrier board can be tessellated with one or more identical other carrier boards with the windings interleaved with each other.

The example of FIG. 1 is a curved spiral, specifically an Archimedean spiral. This has the property that the distance d between windings is fixed. It also has the property that multiple such spirals can be tessellated. The number which can be tessellated corresponds the winding pitch (i.e. sum of the spacing d and the width w of the track) divided by the width of the track, i.e.

$$N=(w+d)/w.$$

This means that a number N of spiral designs may be formed from a single area of board which is then separated into separate identical areas, for example by milling or punching or other cutting technologies. In the cut product, the cutting line thickness will alter this ratio slightly.

The spiral design enables any number of carrier boards to be defined, by suitable selection of the width and spacing. Each individual board needs to meet thermal and mechanical support requirements, as well as having a sufficient width to accommodate the lighting elements 12. As the required heat dissipation falls, the required area of carrier board falls, and the width w can be reduced. This enables more carrier boards to be formed from a given area, giving a cost saving.

The lighting elements follow the spiral pattern. This means they cannot be arranged as a regular rectangular or hexagonal grid. However, they can be arranged such the density of the lighting elements per unit area is substantially constant across the area of the board. For example, they may be spaced evenly along the spiral, and with a spacing which is equal or approximately equal to the winding pitch (w+d) or the winding spacing (d) (for example between 0.5d and 1.5(w+d)).

In order to tessellate the multiple spirals, a rotational shift between adjacent spirals is provided. For N identical spirals, the relative rotational shift between adjacent interleaved spirals is 360/N degrees.

Figure 2A:
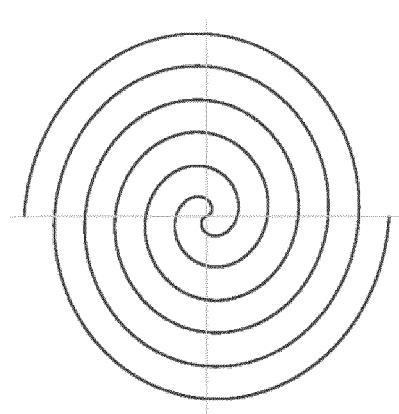
FIG. 2 shows different numbers of interleaved spirals.
Figure 2B:
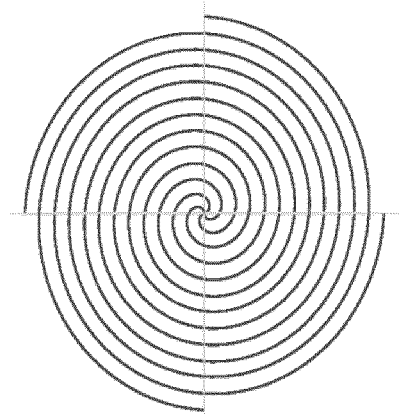
Figure 2C:
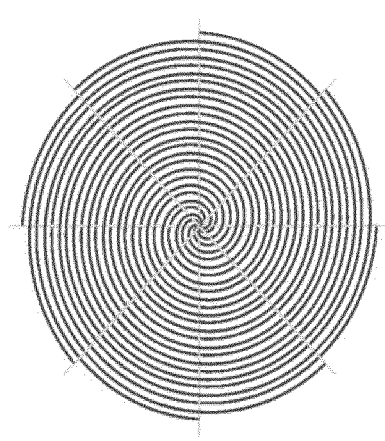

FIG. 2 shows three possible interleaved spiral patterns. It shows each spiral shape as a line for simplicity rather than as a track.

FIG. 2(*a*) shows two interleaved spirals, with a rotational shift of 180 degrees.

FIG. 2(*b*) shows four interleaved spirals, with a rotational shift of 90 degrees.

FIG. 2(*c*) shows eight interleaved spirals, with a rotational shift of 45 degrees.

The carrier board comprises a printed circuit board, although any substrate may be used that provides suitable thermal and mechanical stability and electrical interconnection.

This includes conventional PCBs (multicore PCBs or single core PCBs and of different materials) as well as printed electronics such as electrical traces printed on a metal substrate.

Printed circuit boards are generally laminate structures, and the laminate is most easily formed as a continuous sheet before any substrate shaping takes place. Thus, forming any patterned shape gives rise to PCB wastage. By interleaving the spirals, the full area of the PCB (or nearly the full area) is used to create carrier boards.

The lighting elements are connected together by conductive tracks, to enable the driving of the lighting elements. They may all be in series, in parallel, or there may be a combination of series and parallel connections, for example a set of parallel branches, each branch carrying a set of series lighting elements. The connection terminals (typically only an anode connection and a cathode connection) in one example are provided to the end of the outermost winding, to enable easy electrical connection. The connection may instead be at an intermediate position along the coil shape, to minimize the maximum length of the electrical track used from the connection point to the ends of the spiral. In this way one track along the whole spiral length is replaced by two tracks, each covering a fraction of the spiral length.

A single lighting device with its spiral shaped carrier board may be used in a lighting product. However, for increased light output, a number of lighting devices may be used in a single product. Thus, a single spiral design may be used in a modular manner for different types of lighting product. Generally, a sub-set of the complete number N of spirals is used. If all N spirals are desired in a product, it is more cost effective to provide a single board (i.e. not to perform the cutting and separating process). However, if this is a small fraction of a product range, it may still be more efficient to manufacture using the modular approach. For any number less than N, the use of multiple individual spiral boards is a cost effective solution.

This design is easily modified. For example, the lighting element positions and overall area covered may be kept the same while reducing the spiral width w when there is a reduced need for carrier board area for each lighting element. Thus, more carrier boards of the same optical design can then be made from each processed full area carrier board.

The outer shape of the carrier board is generally circular, so this design is of particular interest for circular products.

As mentioned above, the spiral shape does not give a regular rectangular or square grid of lighting elements, which may be desired.

Figure 3:
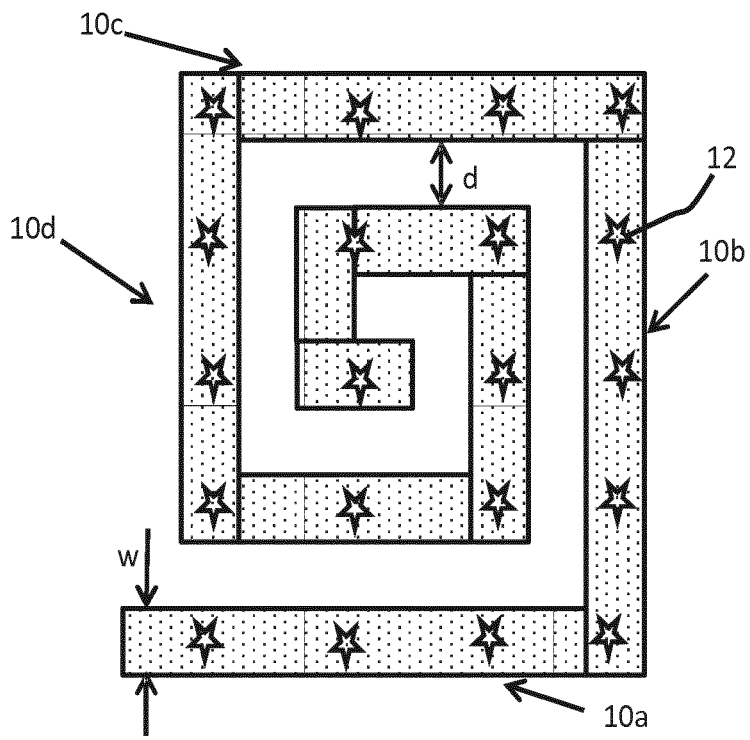
FIG. 3 shows a second example of a lighting device shaped in the form of a spiral.

FIG. 3 shows a second example of lighting device. The carrier board 10 on which the lighting elements 12 are mounted again has a coil shape, but it is an angular structure rather than a smooth spiral.

In this example, the windings comprise straight sections 10a, 10b, 10c, 10d with a 90 degree angle between the adjacent sections along the coil. The perpendicular spacing d between adjacent windings is again constant. The structure thus has a square (or rectangular) spiraling shape.

The constant spacing d between windings means it forms a shape which may be described as a square/rectangular version of an Archimedean spiral. The constant spacing d corresponds to a multiple of the width w of the straight section. The multiple is then the number of other identical shapes which can be tessellated together with the first.

FIG. 3 shows a design which can be tessellated with one other identical coil shape, i.e. N=(d+w)/w=2 (ignoring the thickness of the cutting lines).

The advantage of this design is that the lighting elements 12 may be formed as a regular square (or rectangular) grid. This gives a uniform density of lighting elements across the overall area and therefore a uniform light output.

Figure 4:
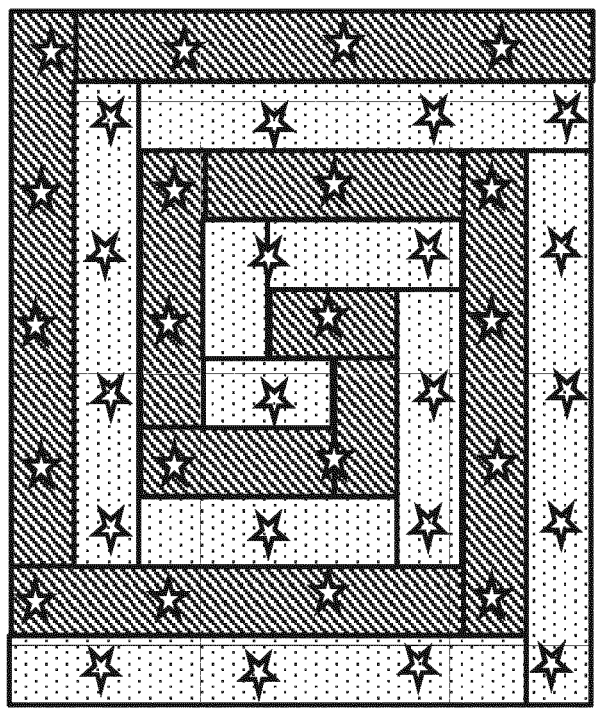
FIG. 4 shows a tesselation of two identical lighting devices of FIG. 3.

FIG. 4 shows two of the carrier boards tessellated to fill a rectangular area, giving no waste of carrier board material. The two lighting devices are thus manufactured together and then separated at the end of the manufacturing process.

The outer shape of the carrier board is generally square/rectangular so this design is of particular interest for square or rectangular products.

A similar square spiral shape may however be used to form four carrier boards, again by reducing the width w of the coil so that N=4.

Figure 5:
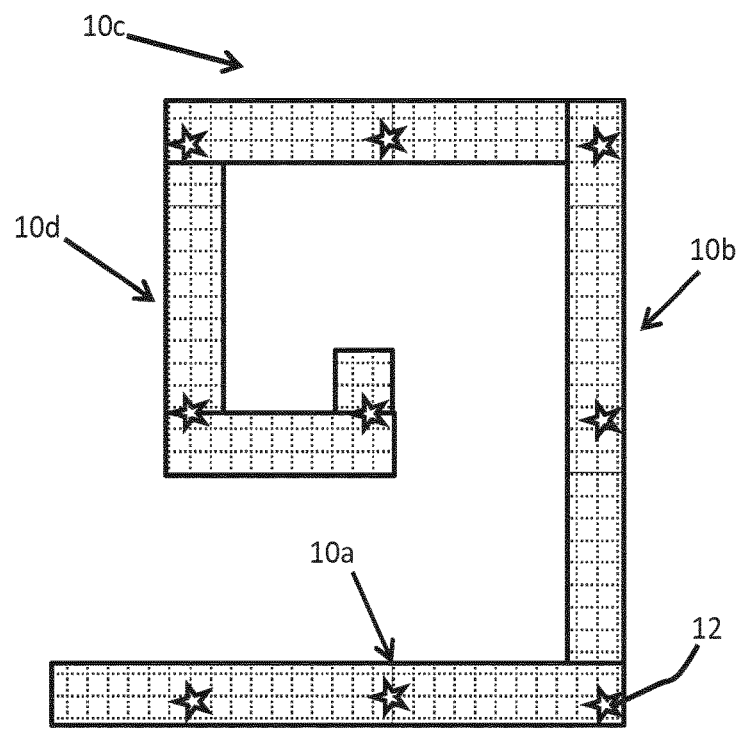
FIG. 5 shows a third example of a lighting device shaped in the form of a spiral.

FIG. 5 shows a third example of lighting device with N=4. This design can be tessellated with three identical other carrier boards with the windings interleaved with each other again to substantially fill an area. This means four such coil shapes can be formed from a board with minimal or no waste of board material.

In the basic design of FIG. 5, the straight sections are all of constant width w.

With this design, it is not possible to position the lighting elements in the center of the sections and still form a regular grid. Instead, the array of lighting elements may form a grid of straight rows and columns of lighting elements, but not a perfectly regular grid. The grid loses its regularity in the center.

Figure 6:
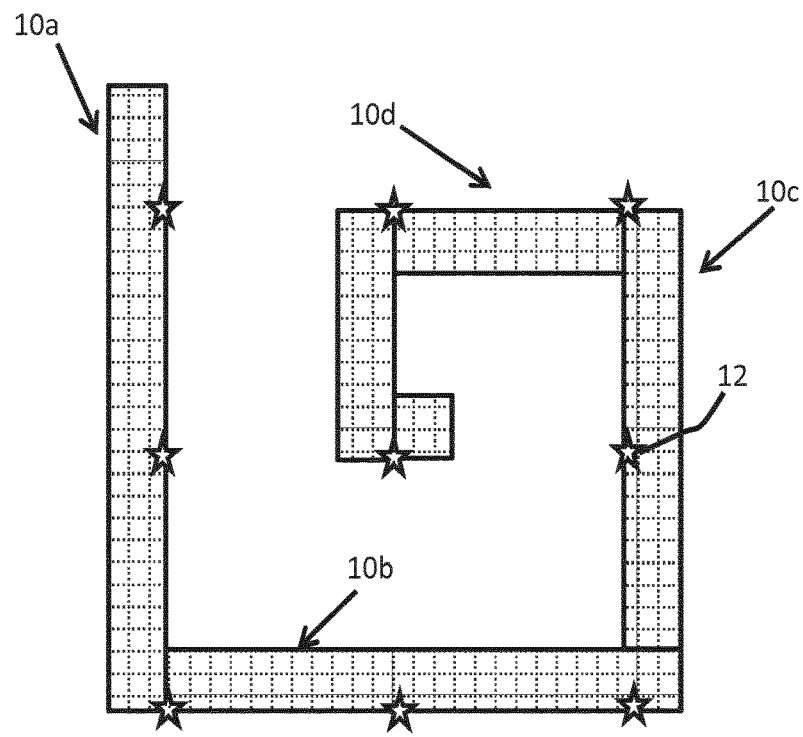
FIG. 6 shows how the lighting device of FIG. 5 cannot support lighting elements in a perfectly regular grid.

FIG. 6 shows how a regular grid can best be fit over the coil shape, and it shows that the lighting element 12 are always centered along the edge of the coil track. Thus, this structure cannot easily be manufactured.

Thus, the basic square coil design only allows two carrier boards to be formed if a regular LED grid is required.

The light intensity variation in the design of FIG. 5 may be acceptable. In particular, it arises only in the center. It may also be compensated by providing lighting elements of different output power at different locations.

Figure 7:
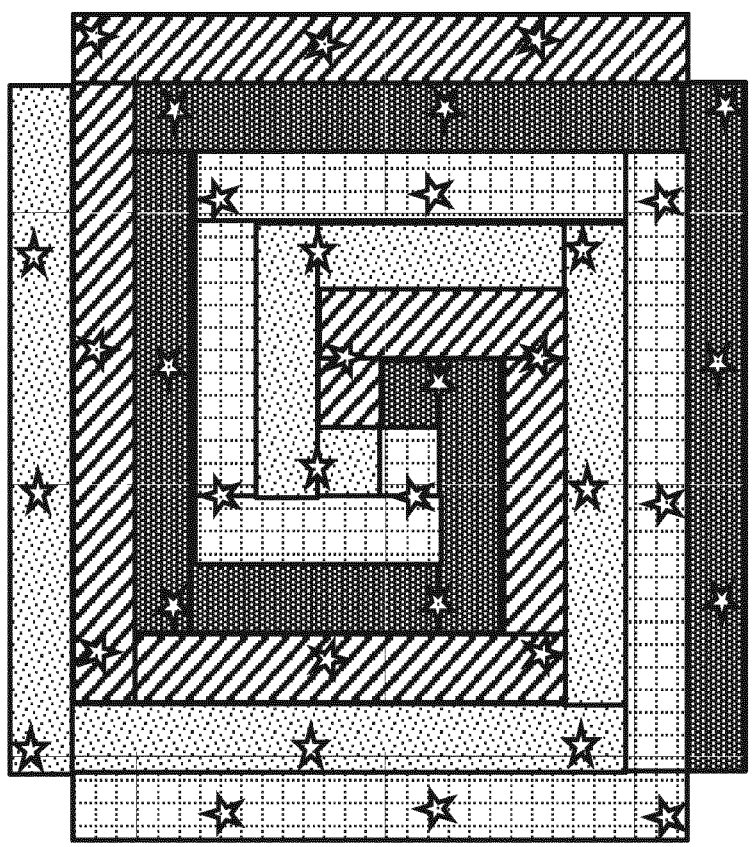
FIG. 7 shows a tesselation of four identical lighting devices of FIG. 5.

FIG. 7 shows four identical lighting devices of FIG. 5 tessellated.

Figure 8:
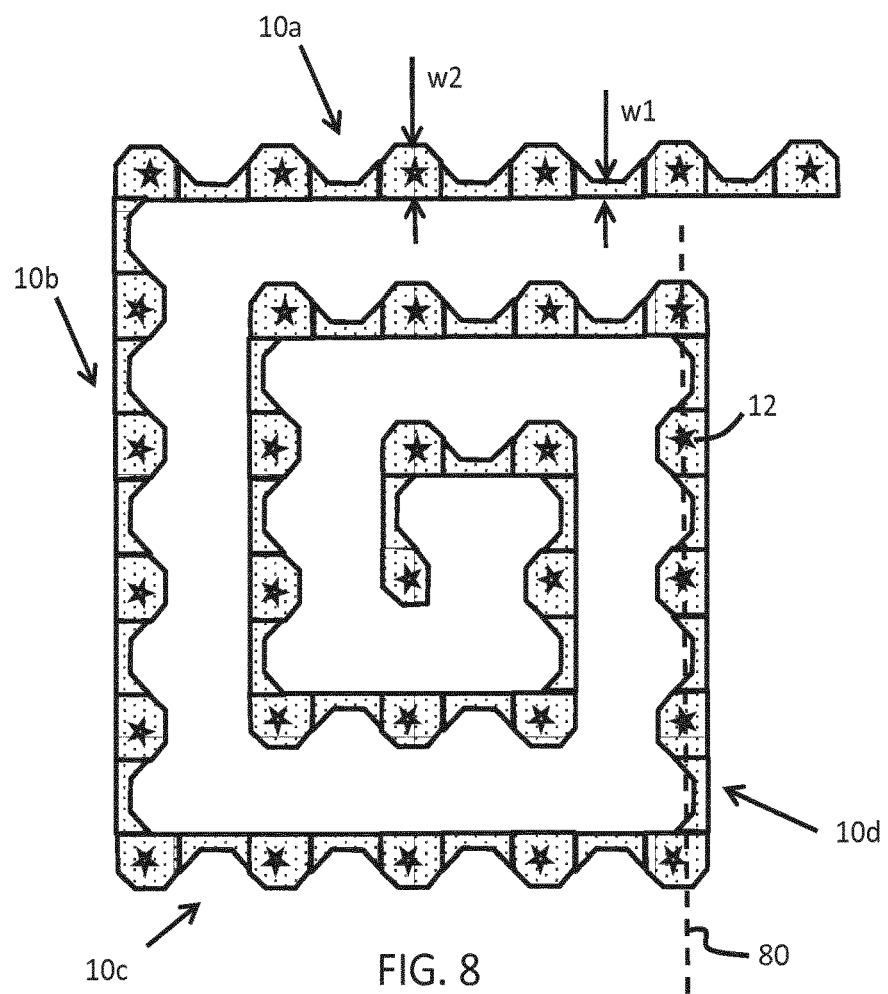
FIG. 8 shows a fourth example of a lighting device shaped in the form of a spiral.

FIG. 8 shows a fourth example of lighting device which enables four identical coil shapes to be formed while also maintaining a regular grid of lighting elements.

Generally, the design has the same overall shape as the design of FIGS. 3 and 5, namely a square/rectangular coil structure.

However, the straight sections 10a, 10b, 10c, 10d have a width which varies between a narrower width w1 and a wider width w2, with the lighting elements 12 positioned at the portions with a wider width. The straight sections are still straight in the sense that they extend along a straight axial direction.

The straight sections may be considered to have a central axis 80 (even though they are not symmetric about this axis), and each straight section has narrow parts and wide parts. The narrow parts mean that the central axis 80 is outside the area of the section, whereas the wide parts mean that the central axis is within the area of the section. In this way, the lighting elements 12 can be positioned along the central axis 80. In this way, the lighting elements can be positioned in the manner shown in FIG. 6.

The wider portions of one straight section mate with a narrower portion of a laterally adjacent winding of a different coil when the multiple coils are tessellated.

One edge of each straight section is straight, and the other edge forms a profiled edge. The narrower width portions may be formed by indents along the profiled edge, wherein the indents for one set of alternate straight sections are at an inside edge and the indents for the other set of alternate straight sections are at an outside edge. Accordingly, the straight edges for one set of alternate straight sections are at an outside edge and the straight edges for the other set of alternate straight sections are at an inside edge.

This means that with each 90 degree rotation between the four different coils when they are tessellated, the wider parts of along the straight section of one coil mate with the narrower parts of an adjacent straight section of a neighboring coil.

Figure 9:
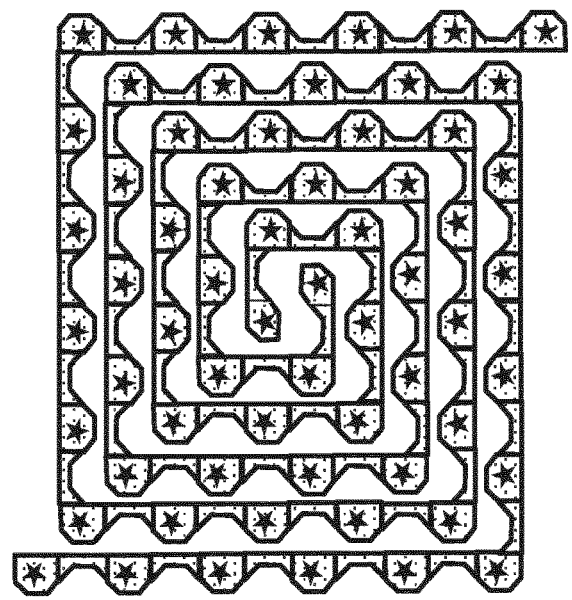
FIG. 9 shows two identical lighting devices of FIG. 8 interleaved with each other.

FIG. 9 shows two identical lighting devices of FIG. 8 interleaved with each other. This produces a device with double the light output flux of the device of FIG. 8, in a modular way. The coils are spaced apart (with a 180 degree rotational shift) to make the combined grid of lighting elements evenly distributed.

A lighting product may use 1, 2, 3 or all four of the lighting devices of FIG. 8.

Figure 10:
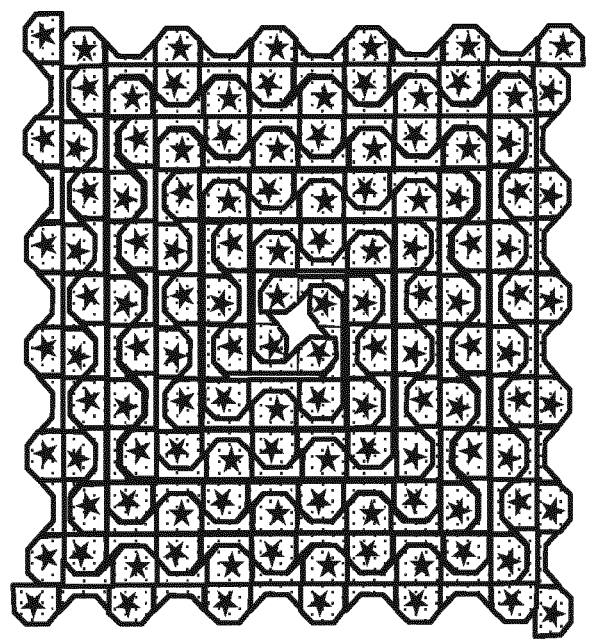
FIG. 10 shows a tesselation of four identical lighting devices of FIG. 8.

FIG. 10 shows four identical lighting devices of FIG. 8 tessellated, which shows how the four lighting devices would be manufactured.

The finite width of the coils means that they do not converge to a perfect point. In this example, there is a small star of PCB board in the center which is not needed in any of the carrier boards, but equally the innermost part of the coil shape could be designed so that all four coils tessellate fully.

The outer shape of the four tessellated coils is generally square, with almost no wastage from a square board.

The designs shown may be stretched along one axis, thereby converting all square profiles into rectangular profiles. In this case, the individual boards will no longer be identical, but they will perform an identical function. The individual boards will then be scalar stretched versions of each other.

Figure 11:
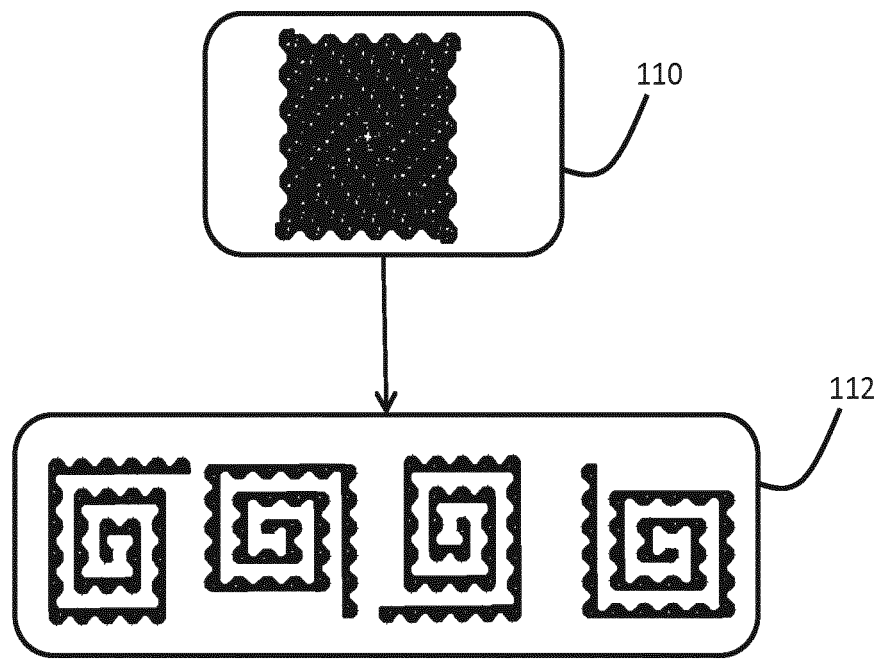
FIG. 11 shows a method of manufacturing lighting devices.

A method of manufacturing a lighting device is shown in FIG. 11. The method comprises:

in step 110 forming an array of lighting elements on a carrier board; and in step 112 separating the carrier board into at least two identically shaped sections (all four are shown in FIG. 11), wherein each section has the coil shape as explained above.

In this way, multiple boards are formed from a single initial board by separating identical shapes which tessellate together. The boards may be fully manufactured before separation.

Figure 12:
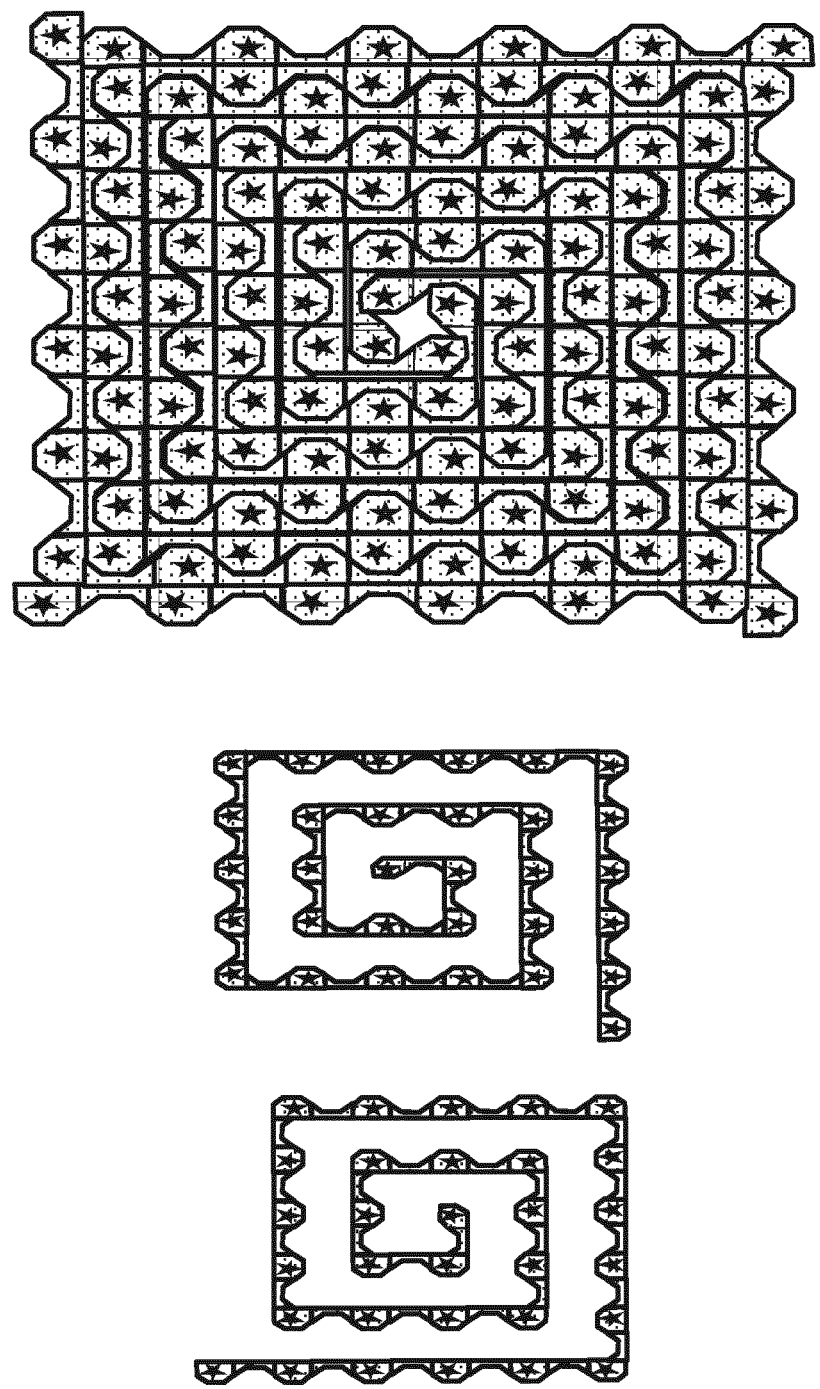
FIG. 12 shows a stretched version of the design of FIG. 10.

As mentioned above, the concept underlying the invention is not changed by a slight variation from a square to a rectangular design. FIG. 12 shows a stretched version of the design of FIG. 10 and also shows two of the individual coils. The shapes are no longer identical, but they are topologically "similar" in that they are scalar stretched versions of each other, and they achieve the same function. Each gives a regular rectangular array of lighting elements.

The same advantage of not wasting board material is obtained, and the same principle of coil tessellation is applied.

The examples above using curved spirals enable any number of interleaved carrier boards to be formed. The square based angular design allows two or four interleaved carrier boards, as a result of the rotational symmetry of order 4. A hexagonal based design may also be used.

The invention is of interest for general illumination luminaires, with a square or circular shape, such as troffers and downlights.

The lighting elements are preferably solid state lighting elements, most preferably LEDs.

The outer dimensions of the coil shaped carrier board may have various different values to fit many different types of lighting device.

Downlight modules typically have a 60 mm diameter. Troffers are typically close to 300×1200 mm or 600×600 mm in some geographic regions, and the light engine is typically 200 to 400 mm square. Light troffers may however, be around 600×1200 mm (2 feet by 4 feet) in particular in the US, and the light engines may then be larger.

The spacing of the LEDs depends on the height of the diffuser over the LEDs. Typical values are 1 to 5 cm. When the LEDs are combined with optical elements to improve the beam spreading, or when the troffer is quite deep, larger spacings can be used, such as 5 to 10 cm. The invention is particularly useful for large spacings, because then there is more unused PCB area in the conventional solution.

The coil width w is for example around 10 mm or less, with a typical LED spacing of around 35 to 40 mm. For four coils, this gives a coil spacing d of 40 mm. Combined with the indentations, the narrowest part becomes about 5 mm.

For electrical safety, the tracks may need about 2 mm spacing from the board edge. This means that more than 40 mm LED spacing is desired to allow for an electrically safe product in case of four spirals. This is not a fundamental limit, because the electrical safety may also be solved by a different electrical layout (for example not all LEDs in series), which would allow for a lower string voltage and a smaller safety margin on the edge.

Generally, the LED spacing is typically more than 5 mm times the number of spirals, and more than 10 mm times the number of spirals when indentations are used.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A lighting device comprising:
a carrier board; and
an array of lighting elements mounted on the carrier board,
wherein the carrier board has a coil shape with at least two converging windings, allowing the carrier board to be tessellated with one or more identically shaped or similarly shaped other carrier boards with the windings interleaved with each other,
wherein the windings comprise straight sections with a 90 degree angle between adjacent sections along the coil, the perpendicular spacing between adjacent windings being a constant, and
wherein the straight sections have a width which varies between a narrower width (w1) and a wider width (w2), the lighting elements being positioned at portions of the straight sections with the wider width (w2), and the array of lighting elements forming a regular square or rectangular grid, and wherein portions of the straight sections with the narrower width are formed by indents, wherein the indents for one set of alternate straight sections are at an inside edge and the indents for the other set of alternate straight sections are at an outside edge.

2. A lighting device as claimed in claim 1, wherein the carrier board can be tessellated with three identical or similar other carrier boards with the windings interleaved with each other.

3. A lighting device as claimed in claim 1, wherein an electrical connector is provided at the outermost end of the coil shape, or at an intermediate position along the coil shape.

4. A method of manufacturing a lighting device, the method comprising the steps of:

forming an array of lighting elements on a carrier board, and separating the carrier board into at least two identically shaped or similarly shaped sections, the array of lighting elements on each section forming a regular square or rectangular grid, wherein each section has a coil shape with multiple converging windings, the windings being interleaved with each other before the separation, wherein the windings comprise straight sections with a 90 degree angle between adjacent sections along the coil, the perpendicular spacing between adjacent windings being a constant, wherein the straight sections have a width which varies between a narrower width (w1) and a wider width (w2), the lighting elements being positioned at portions of the straight sections with the wider width (w2), and wherein portions of the straight sections with the narrower width are formed by indents, wherein the indents for one set of alternate straight sections are at an inside edge and the indents for the other set of alternate straight sections are at an outside edge.

* * * * *